US006798122B1

(12) United States Patent
Howarth et al.

(10) Patent No.: US 6,798,122 B1
(45) Date of Patent: Sep. 28, 2004

(54) LIGHTWEIGHT UNDERWATER ACOUSTIC PROJECTOR

(75) Inventors: Thomas R. Howarth, Washington, DC (US); James F. Tressler, Alexandria, VA (US); Walter L. Carney, Bloomfield, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 65 days.

(21) Appl. No.: 10/289,900

(22) Filed: Nov. 5, 2002

(51) Int. Cl.[7] ................................................ H01L 41/08

(52) U.S. Cl. ....................... 310/344; 310/340; 310/337; 310/342; 310/345

(58) Field of Search ................................ 310/340, 344, 310/337, 342, 345

(56) References Cited

U.S. PATENT DOCUMENTS

| | | | | | |
|---|---|---|---|---|---|
| 3,947,644 | A | * | 3/1976 | Uchikawa | 310/332 |
| 4,999,819 | A | * | 3/1991 | Newnham et al. | 310/337 |
| 5,030,873 | A | * | 7/1991 | Owen | 310/337 |
| 5,185,549 | A | * | 2/1993 | Sullivan | 310/334 |
| 5,196,755 | A | * | 3/1993 | Shields | 310/324 |
| 5,276,657 | A | * | 1/1994 | Newnham et al. | 310/337 |
| 5,471,721 | A | * | 12/1995 | Haertling | 29/25.35 |
| 5,729,077 | A | * | 3/1998 | Newnham et al. | 310/328 |
| 5,889,871 | A | * | 3/1999 | Downs, Jr. | 310/340 |
| 6,465,936 | B1 | * | 10/2002 | Knowles et al. | 310/328 |
| 6,614,143 | B2 | * | 9/2003 | Zhang et al. | 310/317 |
| 6,629,922 | B1 | * | 10/2003 | Puria et al. | 381/312 |
| 6,664,712 | B2 | * | 12/2003 | Rayner et al. | 310/323.02 |

* cited by examiner

*Primary Examiner*—Tran Nguyen
*Assistant Examiner*—J. Aguirrechea
(74) *Attorney, Agent, or Firm*—James M. Kasischke; Michael F. Oglo; Jean-Paul A. Nasser

(57) ABSTRACT

A compound electro-acoustic transducer for producing acoustic signals has a plurality of elements. Each element has a piezoelectric disk with electrically conductive plates fixed on the top and bottom sides of the piezoelectric disk. A stud is joined to an outer face of each plate. Conductors can be joined to each stud. The elements can be assembled on a resilient structure to form an array. Elements can be used in the array or individually accessed.

15 Claims, 5 Drawing Sheets

LIGHTWEIGHT UNDERWATER ACOUSTIC PROJECTOR

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION (1) Field of the Invention

This invention relates to acoustic projectors for sonar use and more particularly to a lightweight acoustic projector that can be used by itself or in an array.

(2) Description of the Prior Art

Low frequency transducers having resonances below about 10 kHz have numerous applications, one of which is as a low frequency sonar projector. This acoustic wavelength corresponding to these frequencies is on the order of the size of naval mines, and thus can hunt for and/or classify them, as well as objects of similar size. Also, wavelengths of this size permit sonar location of buried objects, a task of interest to a wide range of commercial and governmental concerns. Unfortunately, current underwater projectors at these frequencies are large and heavy, and are cumbersome to use on many underwater vehicles.

The U.S. Navy is particularly interested in detecting objects in littoral environments for which small, unmanned submersible vehicles are best-suited. Because of the size constraint of the vehicles, it is necessary to keep the dimensions of the associated acoustic projector systems small, particularly along the protrusion dimensions. Acoustically, the desire is for an acoustic source level greater than 180 dB, while geometrically the projector systems need to be thin (less than 60–65 mm) for installation onto the sides of underwater vehicles and tow sleds ranging in diameter from 15 cm to over 2.4 meters. Conventional transducer designs used to generate high power sound waves at frequencies under 30 kHz include free-flooded piezoelectric ceramic rings, electromagnetic and hydraulic drivers, tonpilz or piston transducers, and flextensional devices. However, because of their large size and weight, these technologies are not easily adaptable for mounting on advanced smaller underwater vehicle platforms.

There are also two other potential low frequency acoustic source candidates: 1–3 type piezocomposites and cymbal-based flat panels. Present state-of-the-art 1–3 piezocomposites have a thickness of 25.4 mm and although this meets the dimensional requirements, it also means that their acoustic source level at frequencies below 10 kHz is lower than desired. To form thicker 1–3 materials requires extensive electronic matching difficulties and impractical manufacturing and handling requirements. U.S. Pat. No. 6,438,242 to Howarth discloses a cymbal-based flat panel projector that meets the dimensional requirements. In this projector design, miniature flextensional electromechanical drivers that are known as 'cymbals' are used to drive a stiff radiating plate. In order to realize optimal acoustic output at low frequencies, an air gap between the radiating plates is required. The typical resonance frequencies for the thin panel projectors is less than 2 kHz. The flat panel design does not allow independent addressing of the projectors. Furthermore, the flat panel imposes an averaging affect on the signal received by each projector.

SUMMARY OF THE INVENTION

Accordingly, an object of the invention is to reduce the cost of active electro-acoustic transducers by use of inherently inexpensive cymbal-type actuators.

Another object is to do the foregoing with a transducer that is inherently rugged.

Yet another object is to provide an acoustic projector that is small, lightweight, and has low vehicle volume occupation.

Still another object is to provide an acoustic projector that allows independent addressing of each projector element.

Accordingly, the invention provides a compound electroacoustic transducer for producing acoustic signals which has a plurality of elements. Each element has a piezoelectric disk with electrically conductive plates fixed on the top and bottom sides of the piezoelectric disk. A stud is joined to an outer face of each plate. Conductors can be joined to each stud. The elements can be assembled on a resilient structure to form an array. Elements can be used in the array or individually accessed.

BRIEF DESCRIPTION OF THE DRAWINGS

These and other features and advantages of the present invention will be better understood in view of the following description of the invention taken together with the drawings wherein.

DESCRIPTION OF THE PREFERRED EMBODIMENT

Figure 1:
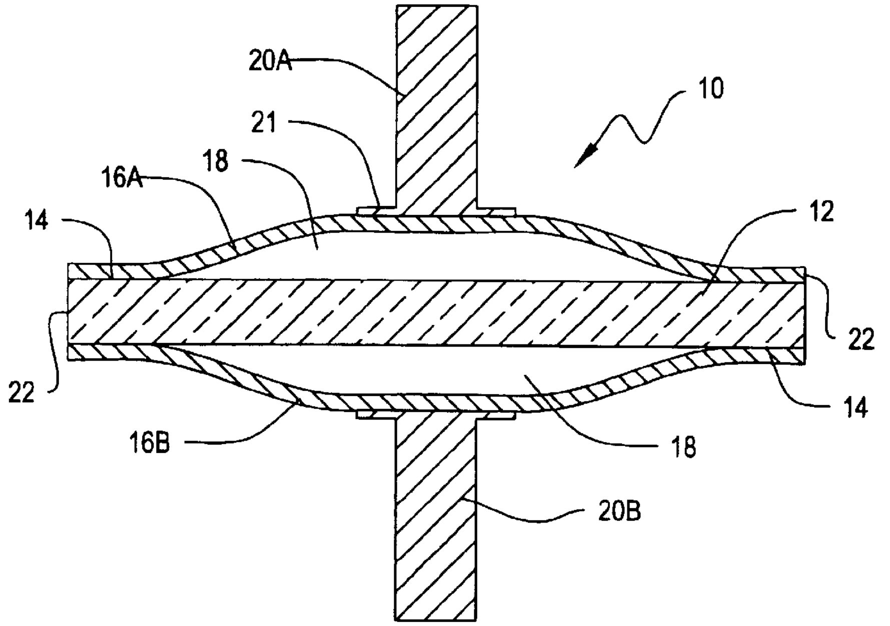
FIG. 1 is a cross-sectional view of a single cymbal driver in accordance with this invention.

This invention describes a thin, lightweight underwater electroacoustic projector with high acoustic output at frequencies from 0.5 kHz to approaching 1 MHz, with an initial resonance output below 10 kHz. In the design described herein, the preferred frequency band of operation is 2.5 kHz to 100 kHz. The device consists of miniature flextensional electro-mechanical drivers that are known as 'cymbals'. FIG. 1 shows a cross-sectional rendering of the cymbal-type driver 10 used in this device. The active material in each driver 10 is a lead zirconate titanate (PZT) piezoelectric ceramic disk 12 poled in its thickness direction. An electrically conductive structural adhesive 14 is used to mechanically and electrically couple conductive endcaps 16A and 16B to the top and bottom faces of the piezoelectric ceramic disk 12. The endcaps 16A and 16B are shaped such that a shallow air cavity 18 is formed between the cap 16A and 16B and the disk 12 after they are bonded together. Prior to bonding to the disk, threaded studs 20A and 20B are microwelded onto the apex of each of the endcaps 16A and 16B, respectively. For this purpose, each stud 20A and 20B can be provided with bosses 21 to provide a better mounting surface. The ceramic disk 12 and endcaps 16A and 16B can be sealed by applying a water proof coating 22 around the periphery of the assembly.

The studs 20A and 20B, in conjunction with the endcaps 16A and 16B, serve as the electrical conduit from the piezoelectric ceramic disk 12 to the electrical lead wires. When an electrical signal is applied to the piezoelectric ceramic disk 12, it either expands or contracts in the radial direction. This expansion and contraction of the piezoelectric ceramic disk 12 causes the dome of the endcaps 16A and 16B to flex. The flexure of the endcaps 16A and 16B subsequently produces the low frequency sound waves that are transmitted into the surrounding medium. The magnitude of the acoustic output, its resonance frequency, and hydrostatic pressure tolerance of an individual cymbal element 10 are dependent upon its dimensions, the geometry of the endcaps, and the materials properties of the components.

In order to enhance acoustic output, lower the fundamental resonance frequency, and provide for directionality of the generated sound, the individual cymbal elements. 10 are incorporated into an array. For incorporating the cymbal elements 10 into an array, the individual elements 10 must be mounted in a way that does not transmit vibrations between the elements, yet acts to hold the elements in a predetermined configuration.

Figure 2A:
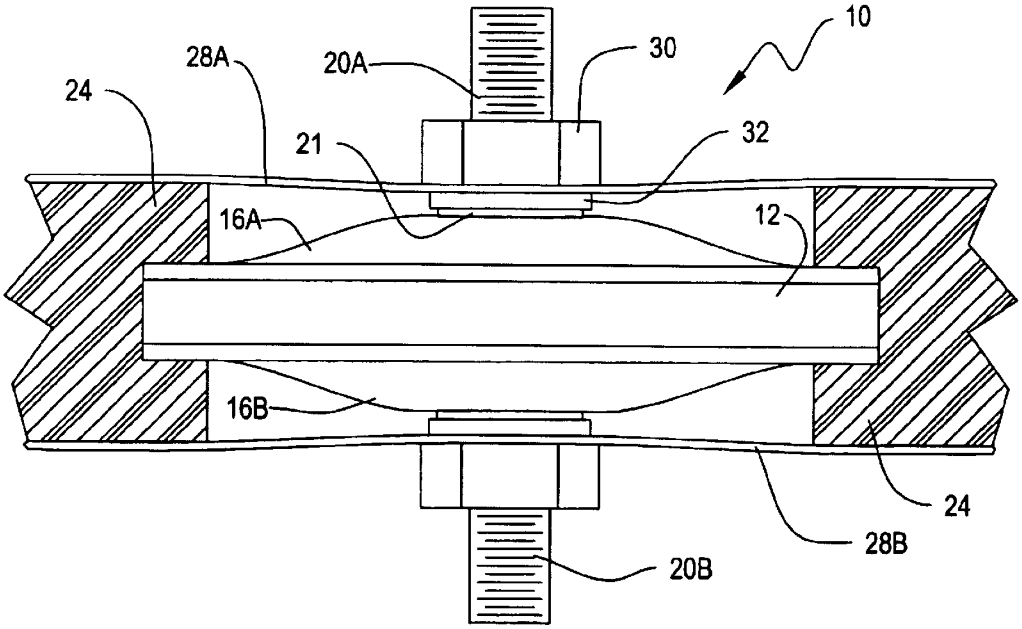
FIG. 2A is a partially cross-sectional view of a single cymbal driver mounted on a support structure.
Figure 2B:
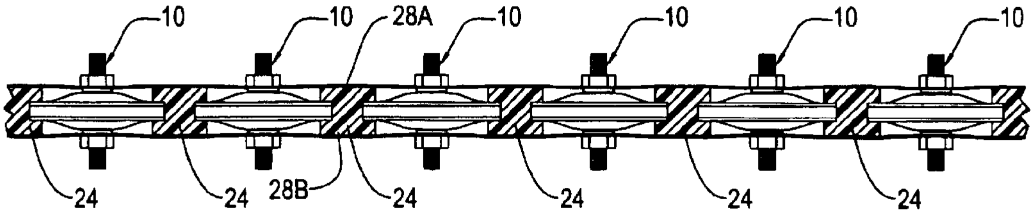
FIG. 2B is a partially cross-sectional view of multiple cymbal drivers mounted on a support structure as an array.
Figure 2C:
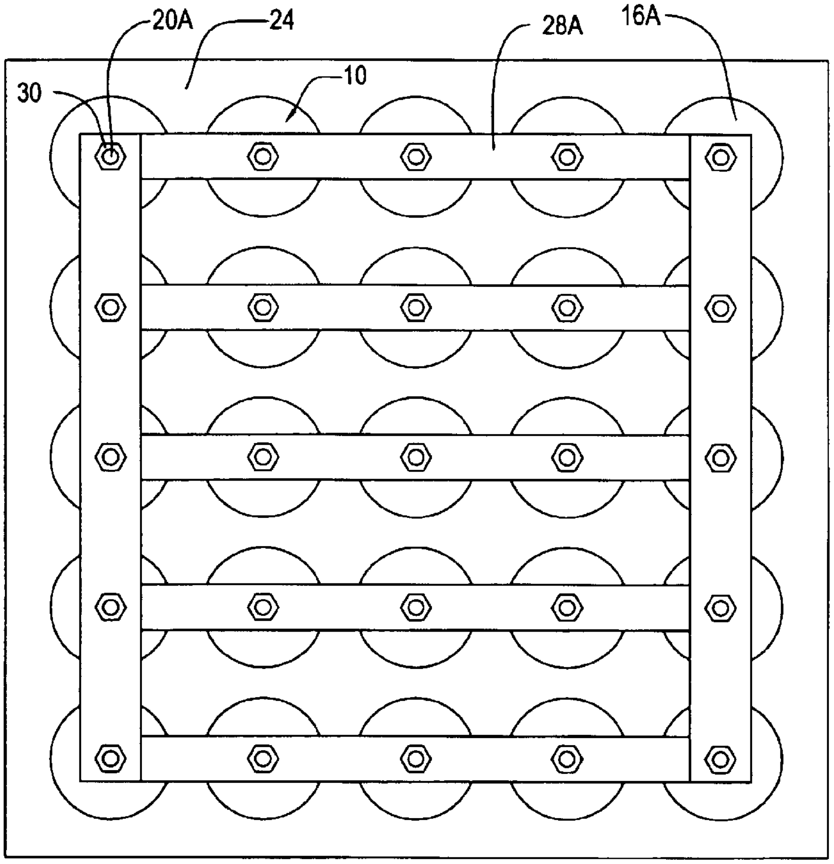
FIG. 2C is a top view of multiple cymbal drivers mounted as an array.

FIG. 2A shows one way to electrically interconnect the individual cymbal elements in a mounting 24. In this case, metal ribbon 28A is used to connect one side of all of the cymbal elements 10. The other pole of cymbal element 10 is connected to metal ribbon 28B. Together, this results in a parallel electrical connection of all of the elements. The ribbons 28A and 28B maintain mechanical and electrical contact with the respective studs 20A and 20B via nuts 30 and washers 32. FIG. 2B shows a partially cutaway side views of an array of cymbal elements 10 held in the mounting 24. FIG. 2C is a view looking from the top of the array.

Figure 3A:
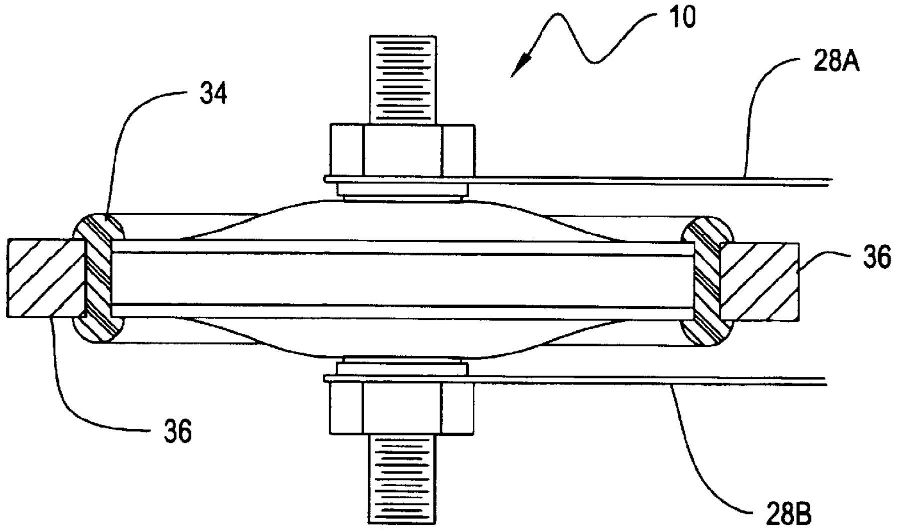
FIG. 3A is a partially cross-sectional view of a single cymbal driver mounted on an alternative support structure.
Figure 3B:
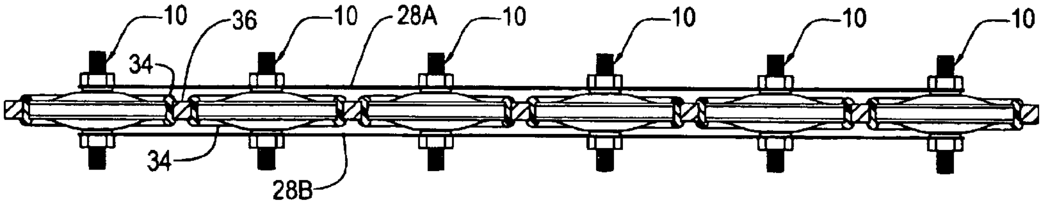
FIG. 3B is a partially cross-sectional view of multiple cymbal drivers mounted on the alternative support structure as an array.
Figure 3C:
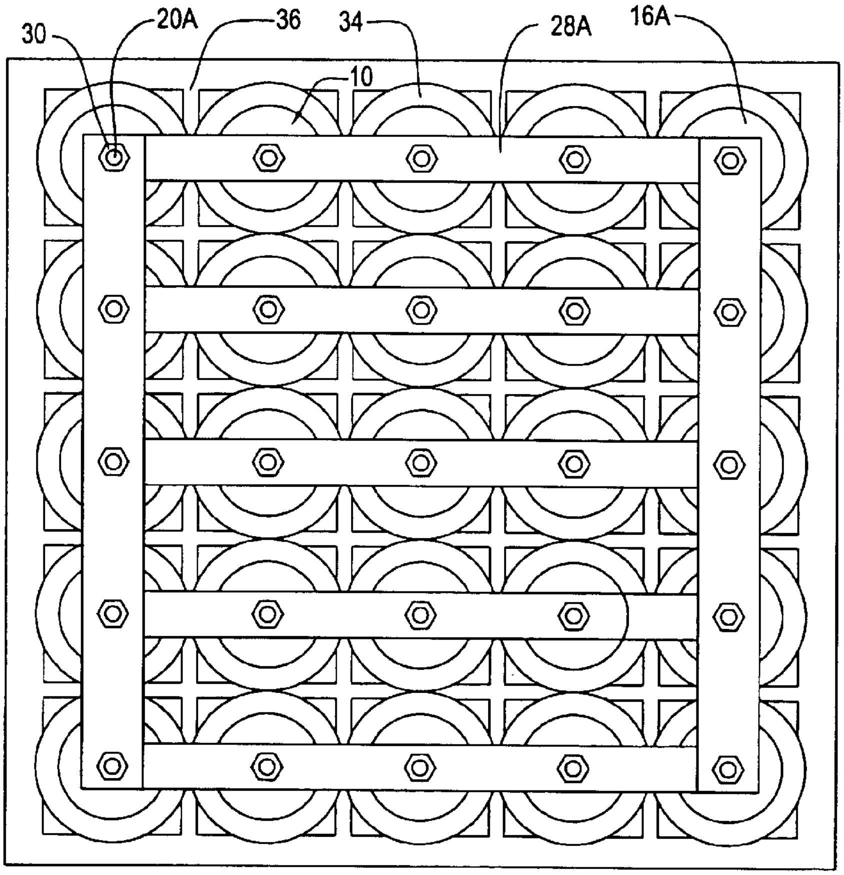
FIG. 3C is a top view of multiple cymbal drivers mounted as an array on the alternative support structure.
Figure 4:
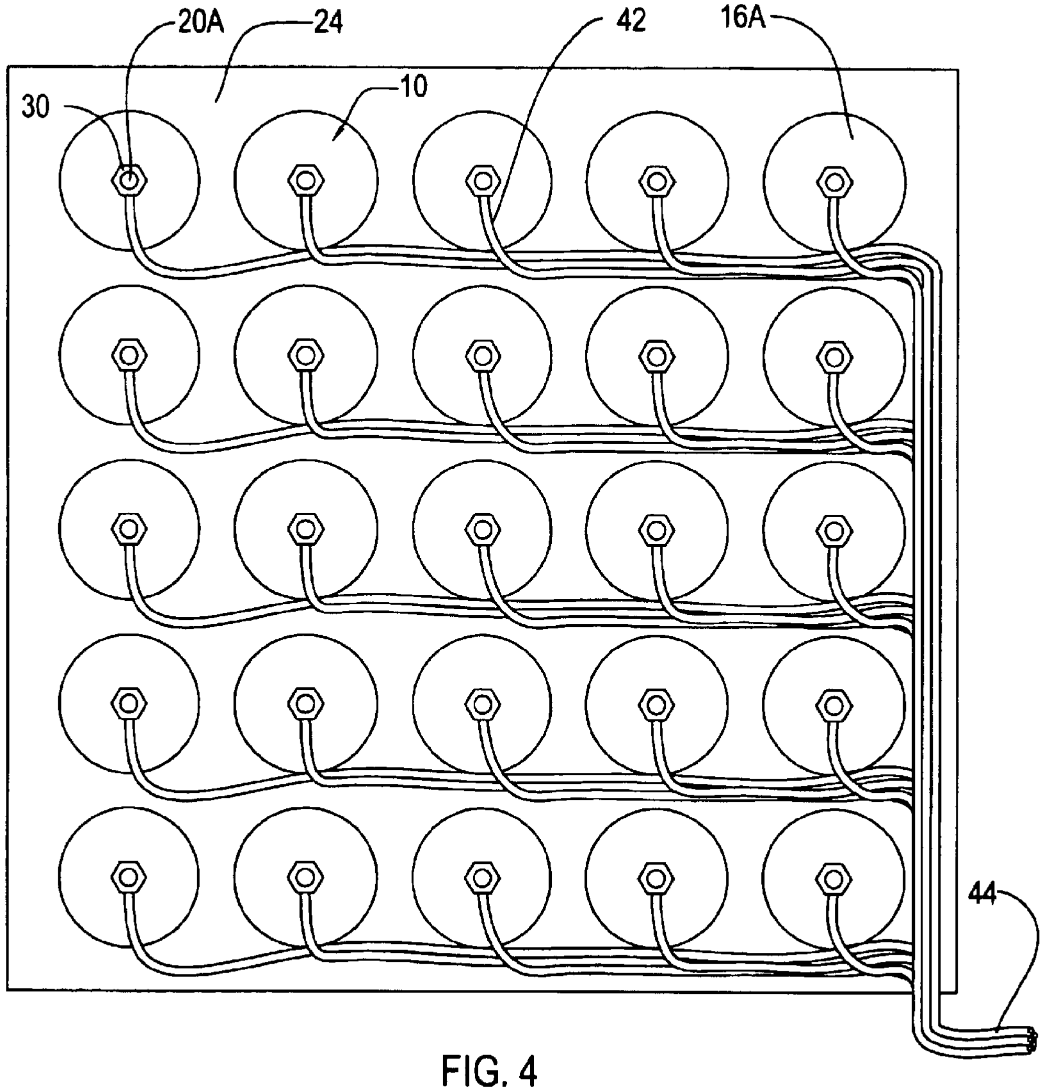
FIG. 4 is a top view of an alternate electrical connection structure for the array.

FIGS. 3A, 3B, and 3C show an alternative mounting configuration for the cymbal elements 10. FIG. 3A shows an array of cymbal elements 10 in a partially cut away side view, and FIG. 3B shows a top view of an array using this mounting. In this embodiment, the cymbal elements 10 are held in place around their outside rim with a rubber grommet 34 within a stiff grid 36. Grommet 34 absorbs vibrations and prevents transfer of these vibrations to grid 36 or between elements 10. Grommet 34 has an inner groove 38 receiving cymbal element 10 and an outer groove 40 contacting grid 36.

The projector design taught in this invention allows for great flexibility in electrical wiring configurations. For instance, instead of electrically wiring in parallel such as in the device described above, each cymbal element 10 or groups of cymbal elements could be wired for individual addressing by individual wires or other conductors 42 which combine to form a wiring harness 44. The bottom side can be configured in a similar fashion or it can use the conductive ribbons taught-in FIGS. 2C and 3C. This would allow for manipulation of electrical impedance, control of beam forming capability through variation of the radiating aperture, and multipurpose acoustic objectives because of this ability to form different apertures within the radiation profile. This means that this device design can have specific apertures for specific frequency bands and specific sonar operations within the same sonar wet-end packaging. Accordingly, this invention provides a projector element and array wherein the low frequency acoustic output from the projector primarily comes from the low frequency resonance associated with the flexure of the cymbal caps. This resonance can be manipulated via mass loading the individual cymbal elements by adding additional nuts and washers. As additional nuts (i.e., mass) are added to each individual cymbal driver, the projector resonance frequency is decreased with the caveat of reduced acoustic source level due to the larger volume velocity required as frequency is lowered.

This projector design is capable of wide frequency coverage because the lowest resonance frequency is controlled by the cymbal cap design, aperture, and mass loading conditions, whereas the upper frequency is determined by the diameter of the piezoelectric ceramic drive element. Consequently, within the same transducer volume package, a sonar capable of low frequency, weapons frequency, and imaging frequencies can be realized. Further manipulation of the operating frequency band can be achieved through the use of different size cymbal elements within the projector.

This projector design is also conducive to the formation of volumetric arrays. In volumetric arrays, two planes of transducers are separated by a given distance (typically a quarter wavelength) so that highly directional (cardioid) radiation beam responses can be realized.

Projectors that utilize this design exhibit hydrostatic pressure dependence at low frequencies. However, acoustic pressure vessel data show that the device can be used up to pressures of 2 MPa with little degradation in performance. In addition, when the device is exposed to very high pressures (e.g., 5.52 MPa) and then returned to a lower pressure (0.02 MPa), catastrophic failure was not experienced. For higher frequency operation (i.e., above 20 kHz), where the radial mode of the piezoelectric ceramic disk (~100 kHz in this device) is the primary contributor to acoustic source generation, hydrostatic pressure dependence is negligible. The utilization of this design should result in higher hydrostatic pressure tolerance at low frequency. This means that through proper design engineering, this projector design should be usable for all sonar applications.

What is claimed is:

1. A compound electro-acoustic transducer for producing acoustic a signals comprising:

a plurality of piezoelectric disks having a top side and a bottom side;

at least one pair of electrically conductive plates for each piezoelectric disk, one said plate being disposed on said top side of said piezoelectric disk and the other said plate being disposed on said bottom side of said piezoelectric disk; and a stud for each said plate joined to an outer face of an associated one of said plates such that said stud extends outward from said associated plate.

2. The apparatus of claim 1 further comprising a water tight sealant surrounding said plates.

3. The apparatus of claim 1 wherein:

said electrically conductive plates disposed on said top side of said piezoelectric disk are electrically joined together; and said electrically conductive plates disposed on said bottom side of said piezoelectric disk are electrically joined together.

4. The apparatus of claim 1 wherein:

each said stud is electrically conductive and is electrically joined to said associated plate; and said studs disposed on associated plates on said top side of said piezoelectric disks are electrically joined together; and said studs disposed on associated plates on said bottom side of said piezoelectric disks are electrically joined together.

5. The apparatus of claim 4 wherein said studs are threaded; and further comprising:

a top side conductive ribbon having a plurality of top side apertures formed therein, said studs disposed on the associated plate on said top side of said piezoelectric disk extending through said top side apertures;

a bottom side conductive ribbon having a plurality of bottom side apertures formed therein, said studs disposed on the associated plate on said bottom side of said piezoelectric disk extending through said bottom side apertures; and a washer threaded on each stud to secure one of said top side conductive ribbon and said bottom side conductive ribbon to said stud.

6. The apparatus of claim 1 wherein:

said plates are formed such that the periphery of the plate contacts said piezoelectric disk and a shallow air cavity is defined between each plate and the acoustic element at the center of the acoustic element; and said stud is mounted to said plate at the center of the plate.

7. The apparatus of claim 6 wherein:

each said stud is electrically conductive and is electrically joined to said associated plate; and said studs disposed on associated plates on said top side of said piezoelectric disks are electrically joined together; and said studs disposed on associated plates on said bottom side of said piezoelectric disks are electrically joined together.

8. The apparatus of claim 7 wherein said studs are threaded; and further comprising:

a top side conductive ribbon having a plurality of top side apertures formed therein, said studs disposed on the associated plate on said top side of said piezoelectric disk extending through said top side apertures;

a bottom side conductive ribbon having a plurality of bottom side apertures formed therein, said studs disposed on the associated plate on said bottom side of said piezoelectric disk extending through said bottom side apertures; and a washer threaded on each stud to secure one of said top side conductive ribbon and said bottom side conductive ribbon to said stud.

9. The apparatus of claim 7 further comprising a plurality of conductors with one conductor being joined to each said stud.

10. The apparatus of claim 7 wherein said studs are threaded; and further comprising:

a plurality of conductors with one conductor being joined to each stud disposed on the associated plate on said top side of said piezoelectric disk; and a bottom side conductive ribbon having a plurality of bottom side apertures formed therein, said studs disposed on the associated plate on said bottom side of said piezoelectric disk extending through said bottom side apertures; and a washer threaded on each stud to secure one of said conductors and said bottom aide conductive ribbon to said stud.

11. A compound electro-acoustic transducer for producing acoustic signals comprising:

a plurality of piezoelectric disks having a top side and a bottom aide;

at least one pair of electrically conductive plates for each piezoelectric disk, one said plate being disposed on said top side of said piezoelectric disk and the other said plate being disposed on said bottom side of said piezoelectric disk;

a stud for each said plate joined to an outer face of an associated one of said plates such that said stud extends outward from said associated plate; and a resilient mounting structure joined between said plurality of piezoelectric disks holding said piezoelectric disks in a mechanically parallel arrangement.

12. An electro-acoustic transducer element comprising:

a piezoelectric disk having a top side and a bottom side;

a pair of electrically conductive plates, one said plate being disposed on said top side of said piezoelectric disk and the other said plate being disposed on said bottom side of said piezoelectric disk; and a stud for each said plate joined to an outer face of an associated one of said plates such that said stud extends outward from said associated plate.

13. The apparatus of claim 12 further comprising a water tight sealant surrounding said plates and said piezoelectric disk.

14. The apparatus of claim 12 wherein each said stud is threaded and electrically conductive and is electrically joined to said associated plate.

15. The apparatus of claim 12 wherein:

said plates are formed such that the periphery of the plate contacts said piezoelectric disk and a shallow air cavity is defined between each plate and the acoustic element at the center of the acoustic element; and said stud is mounted to said plate at the center of the plate.

* * * * *